United States Patent
Schmidt et al.

(10) Patent No.: US 10,681,813 B2
(45) Date of Patent: Jun. 9, 2020

(54) METHOD FOR ELECTRONICS MANUFACTURING USING DIRECT WRITE WITH FABRICATED FOILS

(71) Applicant: United Technologies Corporation, Farmington, CT (US)

(72) Inventors: Wayde R. Schmidt, Pomfret Center, CT (US); Sameh Dardona, South Windsor, CT (US); Slade R. Culp, Coventry, CT (US); Marcin Piech, East Hampton, CT (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 0 days.

(21) Appl. No.: 16/027,466

(22) Filed: Jul. 5, 2018

(65) Prior Publication Data
US 2018/0317322 A1    Nov. 1, 2018

Related U.S. Application Data

(62) Division of application No. 14/743,820, filed on Jun. 18, 2015, now abandoned.

(60) Provisional application No. 62/023,050, filed on Jul. 10, 2014.

(51) Int. Cl.
*H05K 1/16* (2006.01)
*H05K 3/20* (2006.01)

(52) U.S. Cl.
CPC ............ *H05K 1/16* (2013.01); *H05K 3/202* (2013.01); *H05K 2201/0355* (2013.01)

(58) Field of Classification Search
CPC .... H05K 1/141–144; H05K 1/181–188; H01L 23/743
USPC .......................... 361/760–782; 174/250–258
See application file for complete search history.

(56) References Cited

U.S. PATENT DOCUMENTS

| | | | | |
|---|---|---|---|---|
| 5,364,493 A | * | 11/1994 | Hunter, Jr. | C23F 1/02 216/49 |
| 5,748,209 A | | 5/1998 | Chapman | |
| 5,874,881 A | * | 2/1999 | Steinbusch | H02K 3/26 335/222 |
| 6,010,771 A | | 1/2000 | Isen | |
| 6,233,817 B1 | | 5/2001 | Ellis | |
| 6,356,455 B1 | | 3/2002 | Carpenter | |
| 8,013,348 B2 | | 9/2011 | Kishioka | |
| 8,177,348 B2 | * | 5/2012 | Sidhu | H05K 3/12 347/101 |

(Continued)

OTHER PUBLICATIONS

Invitation Pursuant to Rule 63(1) EPC dated Jul. 5, 2016 in European Application No. 15174120.4.

(Continued)

*Primary Examiner* — Tuan T Dinh
(74) *Attorney, Agent, or Firm* — Snell & Wilmer L.L.P.

(57) ABSTRACT

Method for manufacturing an electronic component is provided. The method includes manufacturing elements that are produced by an additive manufacturing process. Moreover, the elements are produced in the same plane or out of plain with one or more foil substrates. The elements may be various structures, including, for example, connectors, electrical components (e.g., a resistor, a capacitor, a switch, and/or the like), and/or any other suitable electrical elements and/or structures.

5 Claims, 3 Drawing Sheets

(56) References Cited

U.S. PATENT DOCUMENTS

| | | | |
|---|---|---|---|
| 2005/0015175 A1* | 1/2005 | Huang | B29C 41/02 |
| | | | 700/121 |
| 2007/0290217 A1 | 12/2007 | Daniels | |
| 2008/0083706 A1* | 4/2008 | Kirmeier | B23K 26/009 |
| | | | 219/72 |
| 2010/0246152 A1* | 9/2010 | Lin | H01L 21/563 |
| | | | 361/783 |
| 2011/0131904 A1 | 6/2011 | Leconte | |
| 2011/0148545 A1* | 6/2011 | Choudhury | B32B 37/185 |
| | | | 333/185 |
| 2014/0191378 A1 | 7/2014 | Lee | |
| 2018/0040419 A1* | 2/2018 | Dardona | H01F 5/003 |

OTHER PUBLICATIONS

Extended European Search Report dated Nov. 3, 2016 in European Application No. 15174120.4.
Pre-Interview First Office Action dated Dec. 30, 2016 in U.S. Appl. No. 14/743,820.
First Action Interview Office Action dated May 9, 2017 in U.S. Appl. No. 14/743,820.
Final Office Action dated Oct. 23, 2017 in U.S. Appl. No. 14/743,820.
Advisory Action dated Jan. 30, 2018 in U.S. Appl. No. 14/743,820.
Office Action dated Apr. 5, 2018 in U.S. Appl. No. 14/743,820.

* cited by examiner

METHOD FOR ELECTRONICS MANUFACTURING USING DIRECT WRITE WITH FABRICATED FOILS

CROSS-REFERENCE TO RELATED APPLICATIONS

This application is a divisional of, claims priority to and the benefit of, U.S. patent application Ser. No. 14/743,820, filed Jun. 18, 2015 entitled "APPARATUS, SYSTEM, AND METHOD FOR ELECTRONICS MANUFACTURING USING DIRECT WRITE WITH FABRICATED FOILS," which is a nonprovisional of and claims priority to and the benefit of U.S. Provisional Application No. 62/023,050, entitled "APPARATUS, SYSTEM, AND METHOD FOR ELECTRONICS MANUFACTURING USING DIRECT WRITE WITH FABRICATED FOILS," filed on Jul. 10, 2014, both of which are hereby incorporated by reference in their entirety.

FIELD

The present disclosure relates to electronic assembly fabrication, and more particularly, hybrid electronic structures of foils and conductive inks.

BACKGROUND

Printing of electronic structures using direct write technologies may be limited to two dimensional structures. Printed structures typically do not have bulk conductivity properties due to residual porosity and/or liquid carrier following deposition. Printed structures also typically benefit from post processing (e.g., thermal processing, laser conditioning and/or the like) to further densify the structures and improve the printed structures electrical and/or conductive properties. Moreover, creation of an electronic assembly using conductive inks can be inefficient and expensive where the entire structure is printed.

SUMMARY

A method for producing an electronic assembly is provided. The method may comprise producing a first foil from a metal substrate by an etching process or micro-machining process. The foil may be a portion of a circuit. The method may further comprise writing a first structure by depositing conductive material via a direct write manufacturing process to the first foil. The first structure may be substantially in a plane defined by the first foil. The method may further comprise writing a second structure by depositing conductive material via the direct write manufacturing process to the first foil. At least a portion of the second structure may be substantially out of the plane defined by the first foil.

In various embodiments an electronic assembly may comprise a first foil, a first electrical element and a second electrical element. The first foil may be produced from a metal substrate. The first electrical element may be deposited via a direct write manufacturing process in a void defined by the first foil. The first electrical element may also be coupled to a first portion of the first foil. The second electrical element may be deposited via the direct write manufacturing process on a second portion of the first foil.

In various embodiments, an electrical assembly may comprise a plurality of foils, and a plurality of conductive structures. The plurality of conductive structures may include a first conductive structure, a second conductive structure and a third conductive structure. The plurality of conductive structures may also be configured to facilitate electronic communication between individual foils of the plurality of foils. The first conductive structure may be coupled to a first foil of the plurality of foils. The first conductive structure may be deposited in a void defined by the first foil. The first conductive structure may also be printed with a first conductive ink. The second conductive structure may be coupled to the first foil and a second foil. The third conductive structure may be coupled to at least one of the first foil or the second foil. The third conductive structure may be an electrical component. The third conductive structure may be an electrical component. The third conductive structure may also be printed with a conductive ink that is identical or different than the first conductive ink.

The forgoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein. Thus, the detailed description herein is presented for purposes of illustration only and not of limitation. The scope of the disclosure is defined by the appended claims. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

In various embodiments, direct write manufacturing techniques make use of conductive inks and/or conductive fluids that are capable of being deposited in single and/or multilayer, high-resolution patterns. In this regard, structures made with direct write manufacturing processes are capable of being precise. Moreover, direct write manufacturing processes are capable of material deposition on both planar and non-planar surfaces (e.g., curved surfaces and/or conformal surfaces). Moreover, by combining direct write technologies and capabilities with prefabricated metal foil structures provide a solution for the creation of complex electrical and/or electronic assemblies with architectures that would otherwise be unobtainable. In alternate embodiments, the inks can comprise conductive, semiconductive, insulating or dielectric materials.

Figure 1:
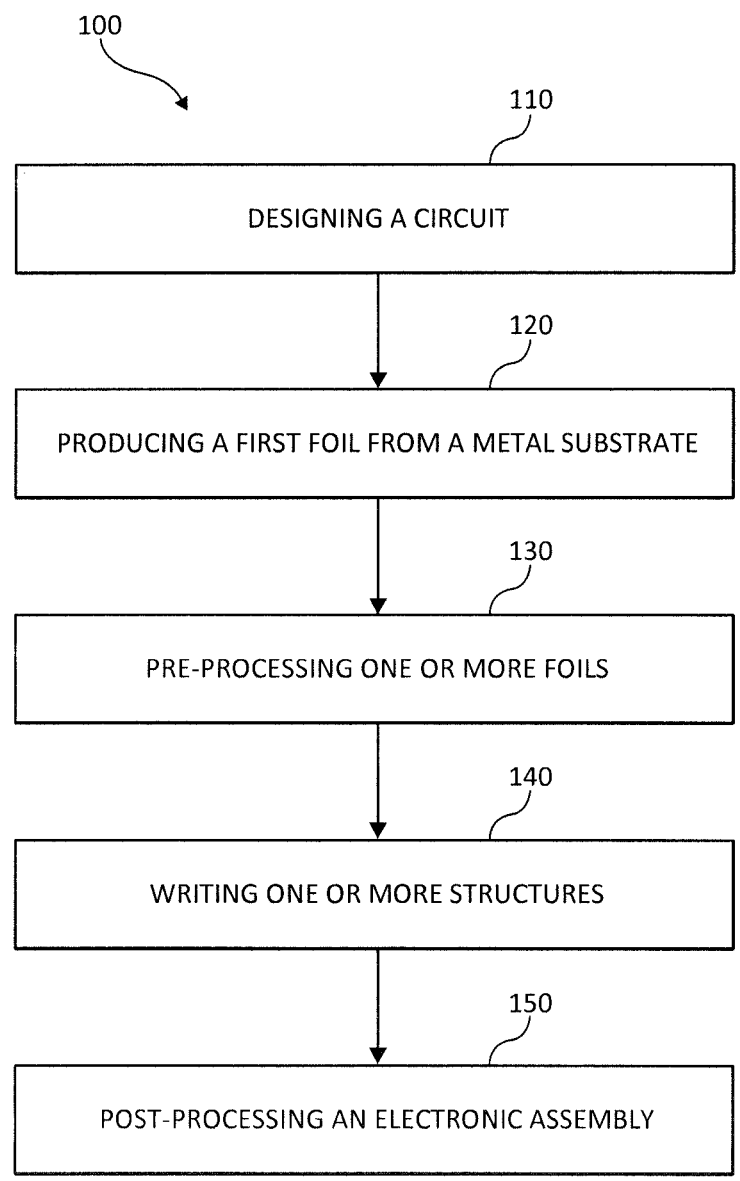
FIG. 1 illustrates a process flow of a method of additive manufacturing of electronics with a foil substrate, in accordance with various embodiments.

In various embodiments and with reference to FIG. 1, a method of creating an electronics assembly is provided. The method 100 for producing an electronic assembly. Method 100 may comprise designing a circuit (Step 110). Based on the circuit design, that method may further comprise producing a foil from a metal substrate (Step 120). In this regard, a foil or a first foil in an electronics assembly may be produced from a metal substrate. Production may include any suitable process including, for example, etching of a metal substrate, micromachining of a metal substrate, and/or any other suitable process. The foil may be a portion of a circuit, and/or a transmission architecture for an electronic assembly. Method 100 may include writing one or more structures (Step 140). For example, the method may include writing a first structure by depositing conductive material via a direct write manufacturing process to a foil. For example, the first structure may be deposited to a void defined by the foil and coupled to a portion of the foil. The first structure may also be deposited on a portion of the circuitry of the foil. The method may further include writing a second structure by depositing conductive material via the direct write manufacturing process to the first foil. In these examples, one or more structures may be deposited and/or manufactured substantially within a plane defined by the foil. Alternatively, one or more of the structures deposited or created by the direct write manufacturing process may be defined substantially out of the plane of the foil. In this regard, a portion of the structure defined substantially out of plane may be deposited on a structure defined by the foil, including, for example, an electrical architecture defined by the foil (e.g., a metal portion of the foil).

In various embodiments, method 100 may further include preprocessing one or more foils (step 130). Preprocessing may include any suitable treatment. For example, preprocessing may include a treatment configured to facilitate bonding between one or more structures created via a direct write manufacturing process and the foil. For example, preprocessing may include spraying the foil with a particular chemical to enhance bonding between the metal foil and the material used to create the structure with the direct write process (e.g., the conductive ink deposited via a direct write manufacturing process). Moreover, the preprocessing may include, for example, heat treating, chemical processing, and/or mechanical surface preparation to prepare the foil surface for further processing, and/or writing via a direct write manufacturing process.

In various embodiments, method 100 may further include post-processing of the electronics assembly (step 150). The electronic assembly may comprise and/or be created by the foil, the first conductive structure and the second conductive structure. In this regard, post-processing may include any suitable finish processing. For example, post-processing may include heat treatment, chemical treatment, mechanical finishing and/or micromachining, and/or any other suitable finishing process. Moreover, post-processing may include coupling of mechanical interfaces, electromechanical interfaces, and/or the like with the electronics assembly.

Figure 2:
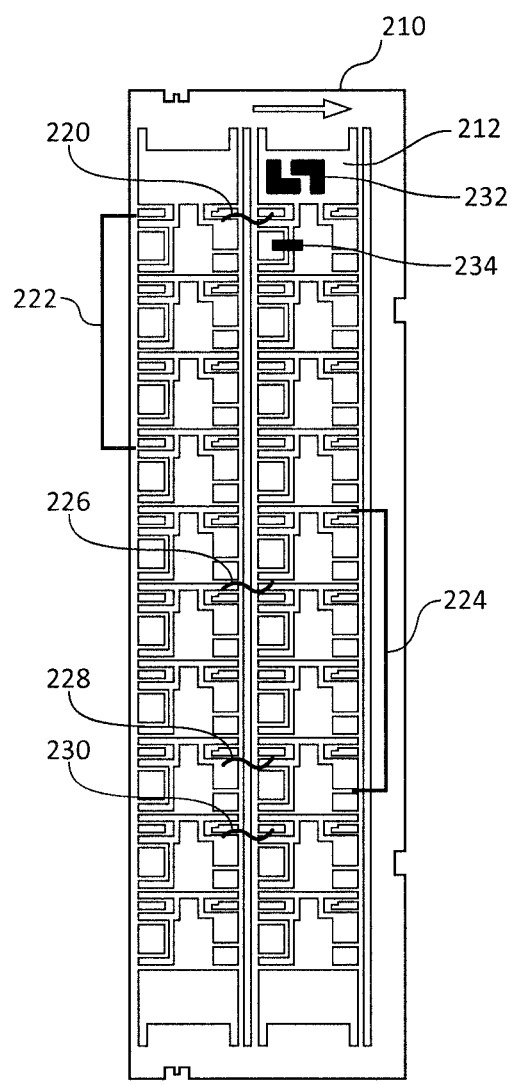
FIG. 2 illustrates a top view of an electronic component, in accordance with various embodiments.

In various embodiments and with reference to FIG. 2, an electronic assembly 200 may comprise a foil 210. Foil 210 may be any suitable foil produced from a substrate. In this regard, the metal substrate may be etchable and/or machinable (e.g., with a micro-machining process) to produce an architecture and/or layout. The architecture may be configured to conduct electricity. Moreover, the substrate may be any suitable metal substrate, including, for example, an aluminum substrate, a copper substrate, a nickel substrate, a steel substrate, an alloy substrate, a superalloy substrate, magnetic alloy substrates, a semi-conductor substrate, polymer composite substrates, conductive polymer substrates, metal-polymer substrates, and/or the like.

In various embodiments, the foil 210 may be a highly-customizable structure. Foil 210 may also be economically produced. Foil 210 may be planar. Foil 210 may also be shaped, bent, folded and/or otherwise distorted into a three-dimensional structure. In this regard, foil 210 may also be non-planar.

In various embodiments, electronic assembly 200 may further comprise one or more electrical elements. For example, electronic assembly 200 may comprise a first electrical element 220, a second electrical element 222, a third electrical element 224, a fourth electrical element 226, a fifth electrical element 228, and a sixth electrical element 230. These electrical elements may be any suitable electronic component and/or structure. These electrical elements may have conductive properties, semi-conductor properties, and/or insulating properties. For example, these electrical elements may be connectors, interfaces, electrical components including, for example, resistors, capacitors, switches, coils, inductors, transformers, heaters, and/or the like, and/or any other suitable conductive components, semiconductor components, and/or insulating components. Moreover, each conductive component may be created with a particular material configured to meet the purpose of the conductive component structure. For example, a first electrical element 220 may be made with a conductive ink via a direct write manufacturing process. The first electrical element 220 may create an electrical relay between a first portion of a foil 210 and a second portion of the foil 210. Second electrical element 222 may be made from a semiconductor material that may be operatively coupled to foil 210 and may be configured to perform a specified function, including, for example, a memory function, a processing function, and/or the like. Moreover, the second electrical element 222 may be operatively coupled via a conductive structure to foil 210 such that the semiconductor structure is an electronic communication with foil 210.

In various embodiments, the various conductive structures such as, for example, structure 232, defined on or in foil 210 may be defined substantially in plane or in shape in a void 212 generally created and/or defined by a foil 210. In this regard, where the structure is substantially in plane, the thickness of the structure may be substantially less than or equal to the thickness of foil 210. A conductive structure 234 may also be defined on the various structures defined by foil 210. In this regard, conductive structure 234 may be defined substantially out of the plane defined by foil 210. The structure may have a thickness that is detectable above the plane and/or surface defined by foil 210. Moreover, the structure may be comprised of a plurality of layer that are capable of functioning as an electrical and/or electronic component. However, where the structure is a connection and/or is a single layer, the structure may have a thickness that is not substantially greater than foil 210. For example, a first electrical element 220 may be defined within one or more voids defined by foil 210. In this regard, first electrical element 220 may be in plane with a particular shape or plane defined by foil 210 such that, the thickness of an electrical element (e.g., first electrical element 220) is not greater than the thickness of foil 210. Another electrical element such as for example, sixth electrical element 230 may be defined on structure that defines foil 210. In this regard, sixth electrical element 230 may be out of plane with the plane and/or shape defined by foil 210. Moreover, the out of plane electrical element (e.g., sixth electrical element 230) may be used as an interface point between one or more foils 210 and/or other suitable interfaces. For example, an out of plane electrical element (e.g., sixth electrical element 230) may be used as an interface between a one or more foils 210, and an electrical connection to monitoring system and/or controller.

Figure 3:
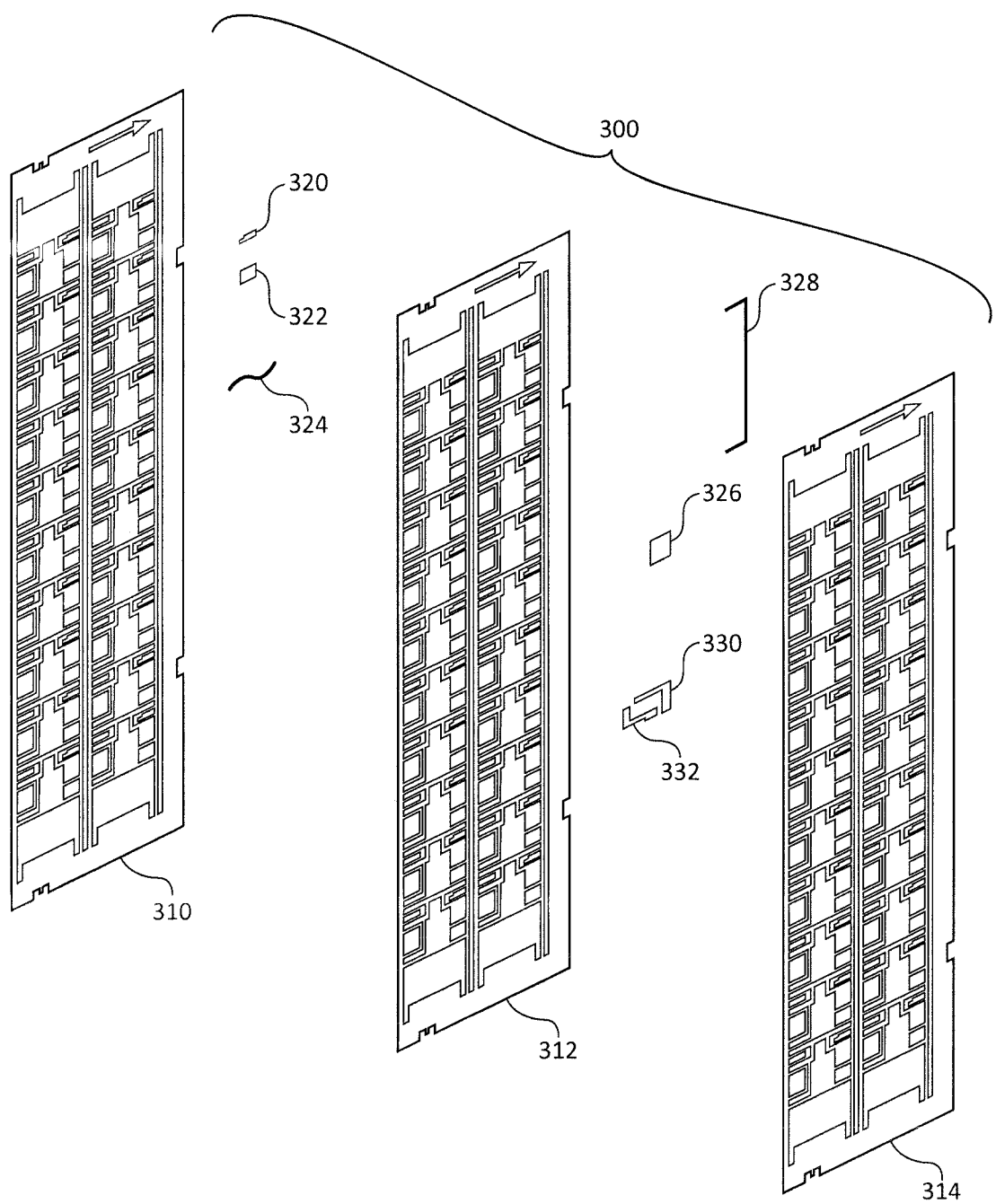
FIG. 3 illustrates a perspective exploded view electronic component, in accordance with various embodiments.

In various embodiments and with reference to FIG. 3, an electrical assembly 300 may comprise a plurality of foils including, for example, first foil 310, second foil 312, third foil 314, and/or the like. Electrical assembly 300 may comprise any suitable number of structures. Moreover, electrical assembly 300 may comprise a plurality of electrical structures and/or electrical elements, for example, first electrical structure 320, second electrical structure 322, third electrical structure 324, fourth electrical structure 326, fifth electrical structure 328, sixth electrical structure 330, seventh electrical structure 332 and/or the like. These structures may be conductive structures, semi-conductive structures, insulating structures, and/or the like. For example, electrical assembly 300 may comprise a first electrical structure 320 that is defined within a plane of a first foil 310. Electrical assembly 300 may further comprise second electrical structure 322 and a third electrical structure 324 that are configured to couple a first foil 310 to a second foil 312. In this regard, second electrical structure 322 and third electrical structure 324 may be conductive and/or semi-conductive.

In various embodiments, an electrical component such as, for example, fourth electrical structure 326 may be a suitable semiconductor structure. The semiconductor structure may include, for example, a processor and/or a memory. Fourth electrical structure 326 may be defined on a complimentary structure of second foil 312 and/or third foil 314. In this regard, fourth electrical structure 326 may be electronic communication with the various components of electrical assembly 300. Moreover, fifth electrical structure 328 may be a connector configured to couple two or more foils together such as, for example, by coupling second foil 312 to third foil 314 and/or first foil 310. In this regard, a portion of fifth electrical structure 328 may be out of plane with second foil 312 and may be in plane with at least one of first foil 310 and/or third foil 314. Moreover, sixth electrical structure 330 and seventh electrical structure 332 may be complimentary structures that are formed from conductive and/or semiconductor materials. These complimentary structures may be deposited on one of first foil 310, second foil 312, third foil 314, and/or the like. The complimentary structures may be configured to perform an electrical functions and/or semiconductor function. For example, sixth electrical structure 330 and seventh electrical structure 332 may be configured as a switch, a capacitor, an inductive generator, and/or the like.

In various embodiments, the customizability of the various foils, electrical structures and components (e.g., components and structures with conductor, semiconductor, and/or insulator properties) make hybrid direct write-foil manufacturing processes and structures an efficient and cost effective solution for creating electronic components. The processes and structures discussed herein provide a unique, efficient, light-weight solution for creating sensors and/or other solid state electronic devices employed in various applications.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of manufacturing an electronic assembly, the method comprising:
producing a first foil and a second foil from a metal substrate by at least one of an etching process or micro-machining process, wherein the first foil comprises a first surface defining a first plane and the second foil comprises a second surface defining a second plane;

writing a first structure by depositing conductive material via a direct write manufacturing process to the first foil, wherein the first structure is substantially disposed within a void defined below the first plane defined by the first surface of the first foil;

writing a second structure by depositing conductive material via the direct write manufacturing process to the first foil, wherein at least a portion of the second structure is substantially above the first plane defined by the first surface of the first foil;

after writing the first structure via the direct write manufacturing process to the first foil and after writing the second structure via the direct write manufacturing process to the second foil, coupling the first foil to the second foil via the second structure such that at least the portion of the second structure is within the second plane defined by the second surface of the second foil; and writing a third structure to the second foil by depositing conductive material via the direct write manufacturing process to the second foil.

2. The method of claim 1, further comprising pre-processing the first foil, wherein the pre-processing includes treating the foil to facilitate bonding of at least one of the first structure or the second structure.

3. The method of claim 1, further comprising post-processing an electronic assembly, wherein the electronic assembly comprises the foil, the first structure and the second structure.

4. The method of claim 1, wherein the first structure is at least one of a connector or an electronic component.

5. The method of claim 1, wherein the second structure is at least one of a connector and an electronic component.

* * * * *